US010401884B2

(12) United States Patent
Chen et al.

(10) Patent No.: US 10,401,884 B2
(45) Date of Patent: Sep. 3, 2019

(54) POWER SUPPLY ARRAY SYSTEM CAPABLE OF OUTPUTTING MULTIPLE VOLTAGES

(71) Applicants: Inventec (Pudong) Technology Corp., Shanghai (CN); Inventec Corporation, Taipei (TW)

(72) Inventors: Wei-Liang Chen, Taipei (TW); Kai-Yang Tung, Taipei (TW); Mao-Ching Lin, Taipei (TW)

(73) Assignees: Inventec (Pudong) Technology Corp., Shanghai (CN); Inventec Corporation, Taipei (TW)

( * ) Notice: Subject to any disclaimer, the term of this patent is extended or adjusted under 35 U.S.C. 154(b) by 215 days.

(21) Appl. No.: 15/469,598

(22) Filed: Mar. 27, 2017

(65) Prior Publication Data

US 2018/0088612 A1 Mar. 29, 2018

(51) Int. Cl.
*G01R 19/165* (2006.01)
*G01R 1/06* (2006.01)
*G05F 1/10* (2006.01)

(52) U.S. Cl.
CPC .................................... *G05F 1/10* (2013.01)

(58) Field of Classification Search
USPC .......................................................... 307/31
See application file for complete search history.

(56) References Cited

U.S. PATENT DOCUMENTS

2004/0201931 A1* 10/2004 Korcharz .................. H02J 1/10 361/18
2014/0103878 A1* 4/2014 Albertson ............. H02J 3/1828 320/127

* cited by examiner

*Primary Examiner* — Rexford N Barnie
*Assistant Examiner* — Xuan Ly
(74) *Attorney, Agent, or Firm* — Winston Hsu

(57) ABSTRACT

A power supply array system includes N first receiving devices and a power supply array device capable of generating N voltages. The power supply array device includes M adjustable power control boards, an adjustable input/output circuit board, and a controller. The M adjustable power control boards are used for outputting the N voltages. Each adjustable power control board has a plurality of output terminals. Each output terminal is used for outputting a voltage. The adjustable input/output circuit board is coupled to the plurality of output terminals of each adjustable power control board for detecting a voltage and a current of each output terminal. The controller is used for receiving data of the voltage and the current of the each output terminal of the each power control board accordingly. N and M are two integers greater than two and N>M.

9 Claims, 4 Drawing Sheets

POWER SUPPLY ARRAY SYSTEM CAPABLE OF OUTPUTTING MULTIPLE VOLTAGES

BACKGROUND OF THE INVENTION

1. Field of the Invention

The present invention illustrates a power supply array system, and more particularly, the power supply array system capable of outputting multiple voltages.

2. Description of the Prior Art

Various cloud computing servers and redundant array of independent disks (RAID) are popularly used in work stations for data communication and data exchange processes. The servers can be categorized as rack servers, blade servers, or specific servers for performing different operational requirements. In a data center or the work station, since numerous data flows are processed instantly, a server array including a huge number of servers is required to deal with the numerous data flows by parallel computing.

In a conventional data center or work station, functions or types of the servers may be different. Thus, each server requires a unique power source for driving the circuit. For example, the data center or the work station includes M servers. M driving voltages of the M servers may be different. Thus, M independent power sources are required to generate the M driving voltages for driving the M servers in the data center or the work station. Unfortunately, when M becomes large (i.e., at least 15-20 independent power sources are required), the M voltages cannot be generated by a single power supply. Thus, numerous power supplies are required in the data center or the work station. For example, 8-10 power supplies are required for driving the M servers. In other words, since numerous power supplies are required, a lot of space of the data center or the work station is occupied.

Further, the conventional power supply lacks a function for monitoring a status of outputting power. The conventional power supply also lacks a function for managing power automatically. As a result, a risk of layout error or voltage mismatch may be triggered. Additionally, it is hard to analyze or detect addresses of error nodes when the layout error occurs.

SUMMARY OF THE INVENTION

In an embodiment of the present invention, a power supply array system is disclosed. The power supply array system comprises a power supply array device and N first receiving devices. The power supply array device is used for generating N voltages. The power supply array device comprises M adjustable power control boards, an adjustable input/output circuit board, and a controller. The M adjustable power control boards are used for outputting the N voltages. Each power control board comprises a plurality of output terminals. Each output terminal is used for outputting a voltage. The adjustable input/output circuit board is coupled to the plurality of output terminals of the each power control board for detecting a voltage and a current of the each output terminal of the each power control board. The controller is coupled to the M adjustable power control boards and the adjustable input/output circuit board for receiving data of the voltage and current of the each output terminal of the each power control board, and for controlling the M adjustable power control boards accordingly. The N first receiving devices are coupled to the M adjustable power control boards. Each first receiving device receives a voltage generated from the power supply array device. N and M are two integers greater than two and N>M.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
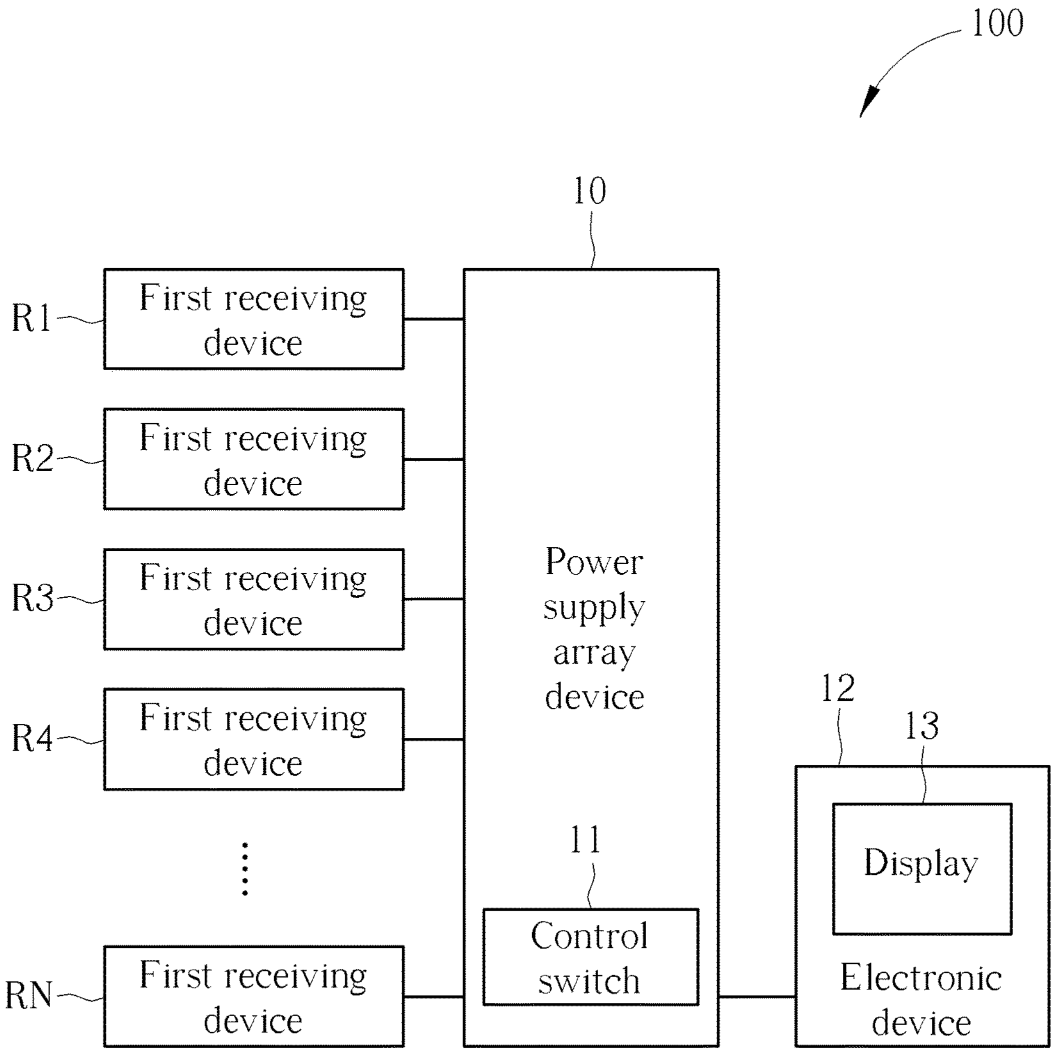
FIG. 1 is a structure of a power supply array system according to an embodiment of the present invention.

FIG. 1 is a structure of a power supply array system 100 according to an embodiment of the present invention. The power supply array system 100 includes a power supply array device 10 and N first receiving devices R1 to RN. The power supply array device 10 can be a server-based power supply array device 10 for generating N voltages to the N first receiving devices R1 to RN. The N first receiving devices R1 to RN can be identical or distinct servers, computers, working machines, or disk drives. A single or a plurality of control switches 11 of the power supply array device 10 can be used for adjusting N target voltages. Precisely, the plurality of control switches 11 are coupled to a controller 14 (in FIG. 2) for adjusting a target voltage corresponding to each voltage of the N voltages. Thus, the power supply array system 100 can output the N voltages approximately equal to N target voltages. However, the power supply array device 10 can use the single control switch 11 for adjusting the N target voltages by a mathematical function. Also, the power supply array system 100 can use a remote control method for adjusting the N target voltages and monitoring the N voltages currently outputted from the power supply array device 10. For example, the power supply array device 10 can be connected to an electronic device 12 through wired (i.e., cable) or wireless (i.e., Wi-Fi or Bluetooth) links. The electronic device 12 can be a computer. The electronic device 12 includes a display 13 for displaying a monitoring interface. The power supply array device 10 can transmit monitoring data of the N voltages and N currents to the electronic device 12. Thus, the monitoring interface can display the data of the N voltages and N currents. Further, a user can set and adjust the N target voltages remotely by using the monitoring interface on the display 13. By doing so, the power supply array system 100 can be remotely controlled to output the N voltages approximately equal to the N target voltages. In the power supply array system 100, each first receiving device is coupled to a corresponding output terminal of the power supply array device 10 for receiving a voltage generated from the power supply array device 10. In FIG. 1, the N first receiving devices R1 to RN receive the N voltages (i.e., the N voltages independently generated from the power supply array device 10) respectively. The N voltages can be customized to approach the N target voltages required by the N first receiving devices. In the power supply array system 100, N is an integer greater than two.

Figure 2:
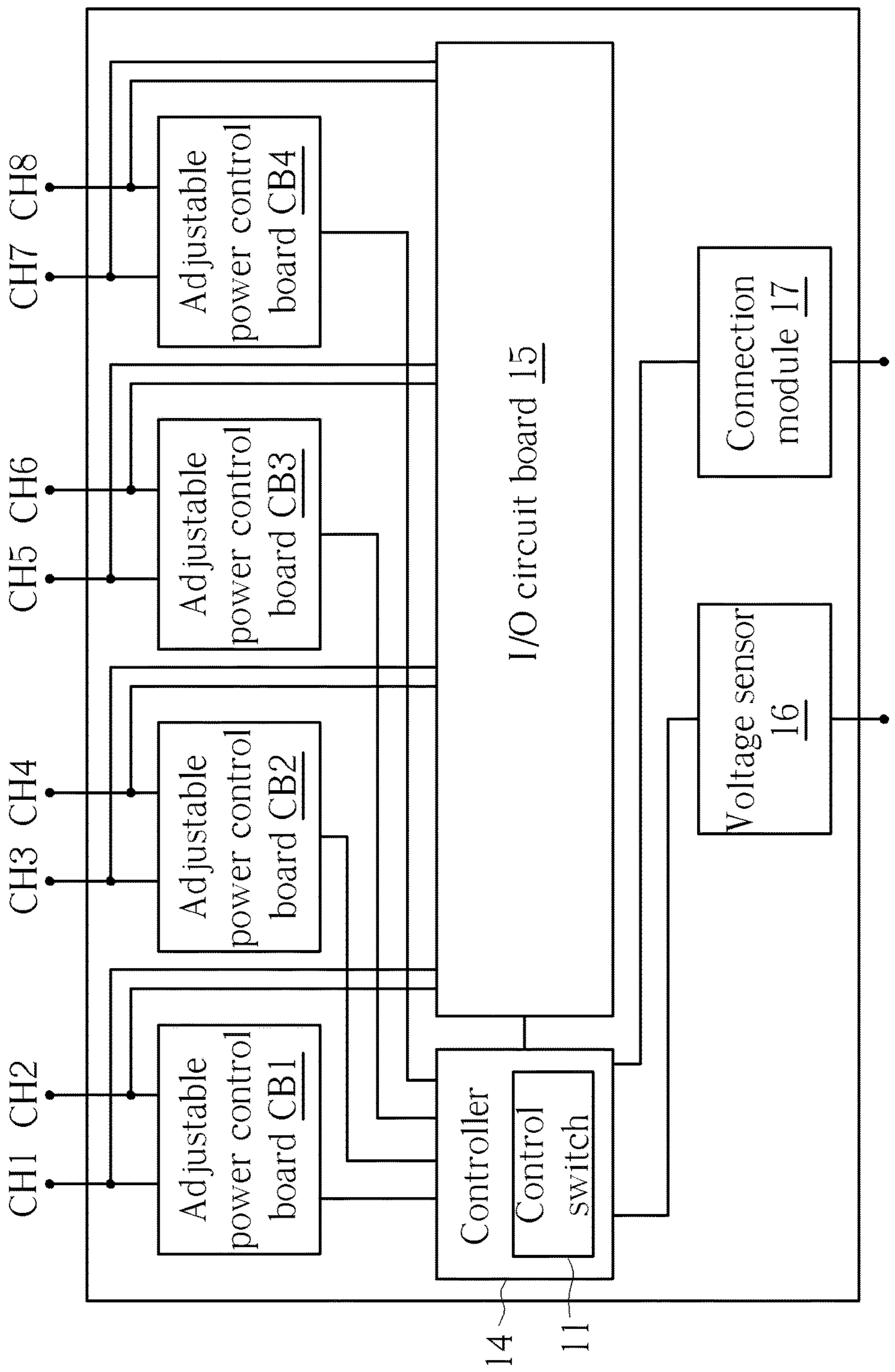
FIG. 2 is a block diagram of a power supply array device of the power supply array system in FIG. 1.

FIG. 2 is a block diagram of the power supply array device 10 of the power supply array system 100. The power supply array device includes M adjustable power control boards, an adjustable input/output (I/O) circuit board 15 (hereafter, say I/O circuit board 15), a controller 14, a voltage sensor 16, and a connection module 17. For presentation simplicity, the power supply array device 10 outputs eight voltages (N=8). Further, four adjustable power control boards CB1 to CB4 are introduced (M=4). Particularly, circuits of adjustable power control boards CB1 to CB4 can be identical. However, the embodiment is not limited to N=8 and M=4. For example, N and M can be two arbitrary integers greater than two and N>M. In the power supply array device 10, the adjustable power control boards CB1 to CB4 are used for outputting eight voltages through output terminals CH1 to CH8 respectively. Here, each adjustable power control board includes a plurality of output terminals. For example, the adjustable power control board CB1 includes two output terminals CH1 and CH2. The adjustable power control board CB2 includes two output terminals CH3 and CH4. The adjustable power control board CB3 includes two output terminals CH5 and CH6. The adjustable power control board CB4 includes two output terminals CH7 and CH8. However, the embodiment is not limited to introduce two output terminals in each adjustable power control board. The I/O circuit board 15 is coupled to the output terminals CH1 to CH8 for detecting a voltage and a current of each output terminal. Further, the I/O circuit board 15 can transmit data of the voltage and current of each output terminal to a controller 14. In the power supply array device 10, the controller 14 is coupled to the adjustable power control boards CB1 to CB4 and the I/O circuit board 15 for receiving the data of the voltage and current of each output terminal. Additionally, the controller 14 can control operations of the power supply array device 10. In other words, the controller 14 can use various control modes for controlling the adjustable power control boards CB1 to CB4 in order to adjust voltages outputted from the output terminals CH1 to CH8, as described below.

In the first control mode, the controller 14 receives the data of the voltage and current of each output terminal. When a current of an output terminal is greater than a predetermined value (i.e., a glitch may occur when a corresponding first receiving device is operated under a short state), the controller 14 can enable an over voltage protection circuit (OVP) or an over current protection circuit (OCP) for disabling the output terminal. Also, the controller 14 can automatically control voltages outputted from other available output terminals substantially equal to the target voltages. The controller 14 can also control voltage fluctuations of the other available output terminals within a tolerable range. In the second control mode, users can manually control a control switch 11 coupled to the controller for setting the target voltages corresponding to the output terminals CH1 to CH8. In the third control mode, the controller 14 is coupled to the connection module 17. The controller 14 can transmit the data of the voltage and current of each output terminal to the electronic device 12. Then, a user can adjust the target voltages corresponding to the output terminals CH1 to CH8 by operating the monitoring interface displayed on the electronic device 12. As a result, the power supply array device 10 has a capability for managing power automatically or manually. In other words, when an output terminal abnormally outputs a voltage, the power supply array device 10 can be protected. Further, voltages outputted from other available output terminals can also be stabilized. Also, a remote control is introduced for adjusting the target voltages and monitoring the voltages currently outputted from the output terminals CH1 to CH8. Thus, the power supply array device 10 has a capability for outputting stabled and customized multiple voltages. The monitoring interface displayed on the display 13 of the electronic device 12 is illustrated below.

Figure 3:
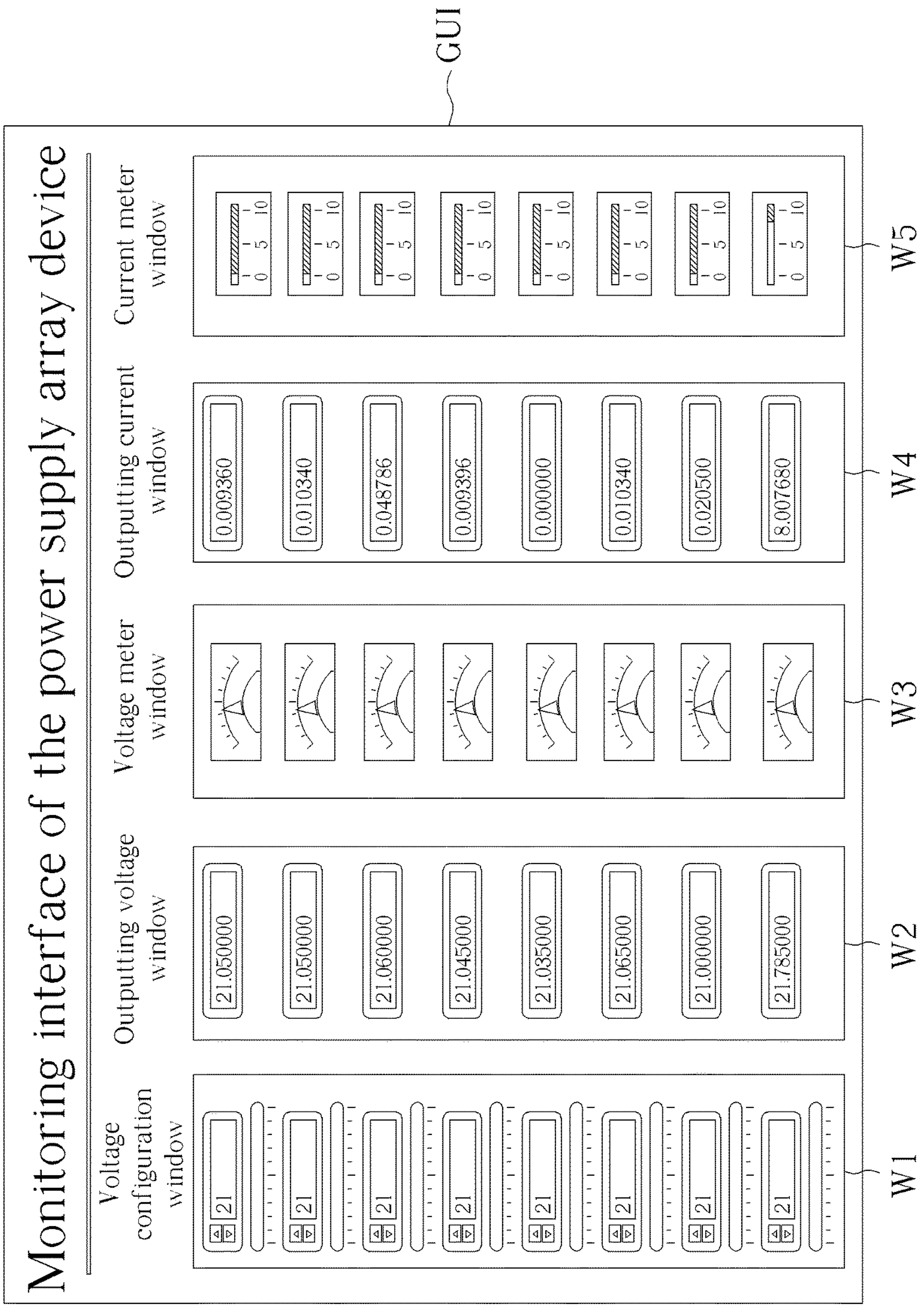
FIG. 3 is a monitoring interface of a display of the power supply array system in FIG. 1.

FIG. 3 is the monitoring interface GUI displayed on the display 13 of the electronic device 12. In the embodiment, the power supply array device 10 can establish wired or wireless links to the electronic device 12. The controller 14 of the power supply array device 10 can transmit the monitoring data of the voltage and the current outputted from each output terminal to the electronic device 12 through the connection module 17 (shown in FIG. 2). Then, the display 13 of the electronic device 12 generates the monitoring interface GUI. However, the embodiment is not limited to use the monitoring interface GUI shown in FIG. 3. Any reasonable modification of the monitoring interface GUI falls into the scope of the present invention. In FIG. 3, the monitoring interface GUI includes a voltage configuration window W1, an outputting voltage window W2, a voltage meter window W3, an outputting current window W4, and a current meter window W5. The voltage configuration window W1 is used for displaying N target voltages. For example, in the embodiment, the voltage configuration window W1 can display eight target voltages (i.e., equal to 21 volts) corresponding to the output terminals CH1 to CH8. A user can adjust at least one target voltage of the eight target voltages corresponding to the output terminals CH1 to CH8 by operating the voltage configuration window W1. For example, the user can adjust a target voltage corresponding to a terminal CH3 from 21 volts to 25 volts. The outputting voltage window W2 is used for displaying the N voltages outputted from the M adjustable power control boards currently. For example, in the embodiment, the outputting voltage window W2 can display eight voltages currently outputted from the output terminals CH1 to CH8. Specifically, when the eight target voltages are preset, the output terminals initially output the eight voltages according to the eight target voltages. However, each first receiving device can be regarded as a circuit device having impedance. The impedance may be fluctuated within an expected range. Also, the eight voltages outputted from the output terminals CH1 to CH8 may be fluctuated because of an ambient temperature, humidity, and/or an electromagnetic pulse. Thus, each target voltage displayed on the voltage configuration window W1 may not be equal to a corresponding voltage displayed on the outputting voltage window W2. For example, a target voltage corresponding to an output terminal CH1 is equal to 21 volts. A voltage currently outputted from the output terminal CH1 is equal to 21.05 volts. A target voltage corresponding to an output terminal CH8 is equal to 21 volts. A voltage currently outputted from the output terminal CH8 is equal to 21.785 volts. Further, as aforementioned illustration, the power array device 10 has a capability for managing power automatically. Thus, each voltage currently outputted from the corresponding output terminal is controlled to meet its target voltage as precise as possible. The voltage meter window W3 is used for display ratios of the eight voltages to a maximum voltage supported by the adjustable power control boards. For example, the voltage currently outputted from the output terminal CH8 is equal to 21.785 volts. The maximum voltage is equal to 52 volts. A pointer can be introduced to the voltage meter window W3 for indicating a proportion of the voltage (21.785 volts) to the maximum voltage (52 volts). Here, each voltage currently outputted from the corresponding output terminal can be displayed by using its own pointer illustrated in the voltage meter window W3.

The outputting current window W4 is used for displaying eight currents generated from the power supply array device 10 through the eight first receiving devices (i.e., first receiving devices R1 to R8 for N=8). In other words, the outputting current window W4 can display eight "real time" currents corresponding to eight output terminals CH1 to CH8. As aforementioned illustration, each first receiving device can be regarded as a circuit device having impedance, such as a resistance R (i.e., single phase impedance). Thus, when an output terminal outputs a voltage equal to V, a current equal to I is formed while satisfying I=V/R. For example, the outputting current window W4 can display a current corresponding to an output terminal CH1 equal to 0.009396 ampere (hereafter, say "A"). The outputting current window W4 can display a current corresponding to an output terminal CH8 equal to 8.00768 A. In the embodiment, according to information of the outputting current window W4, it implies that impedance of a receiving device R8 coupled to the output terminal CH8 is smaller than impedance of a receiving device R1 coupled to the output terminal CH1. The current meter window W5 is used for displaying ratios of the eight currents to a maximum current supported by the adjustable power control boards. For example, the current corresponding to the output terminal CH8 is equal to 8.00768 A. The maximum current is equal to 10 A. A bar chart can be introduced to the current meter window W5 for indicating a proportion of the current (8.00768 A) to the maximum current (10 A). Here, each current currently outputted from the corresponding output terminal can be displayed by using its own bar chart illustrated in the current meter window W5.

By using the monitoring interface GUI illustrated in FIG. 3, a user can remotely monitor all target voltages, all "real-time" outputted voltages, and all "real-time" outputted currents. Further, the user can adjust at least one target voltage by operating the voltage configuration window W1 of the monitoring interface GUI. For example, when a high current (8.00768 A) corresponding to the output terminal CH8 is observed by the user through the current meter window W5, the user can appropriately adjust a target voltage corresponding to the output terminal CH8 through the voltage configuration window W1 for reducing a risk of short circuit. Thus, the power supply array device 10 has a high operational flexibility.

In the following, a voltage sensor (V-Sense) can be introduced to the power supply array device 10. A voltage compensation process is automatically triggered when a driving voltage of a first receiving device is dropped. For example, when the first receiving device is coupled to another circuit device in series, a driving voltage drop of the first receiving device occurs because the driving voltage of the first receiving device is partitioned according to an impedance ratio of the first receiving device to another circuit device. For presentation completeness, the power supply array system 100 is considered to introduce an additional receiving device. For avoiding ambiguity, the power supply array system 100 with the additional receiving device is denoted as the power supply array system 200 in the following illustration.

Figure 4:
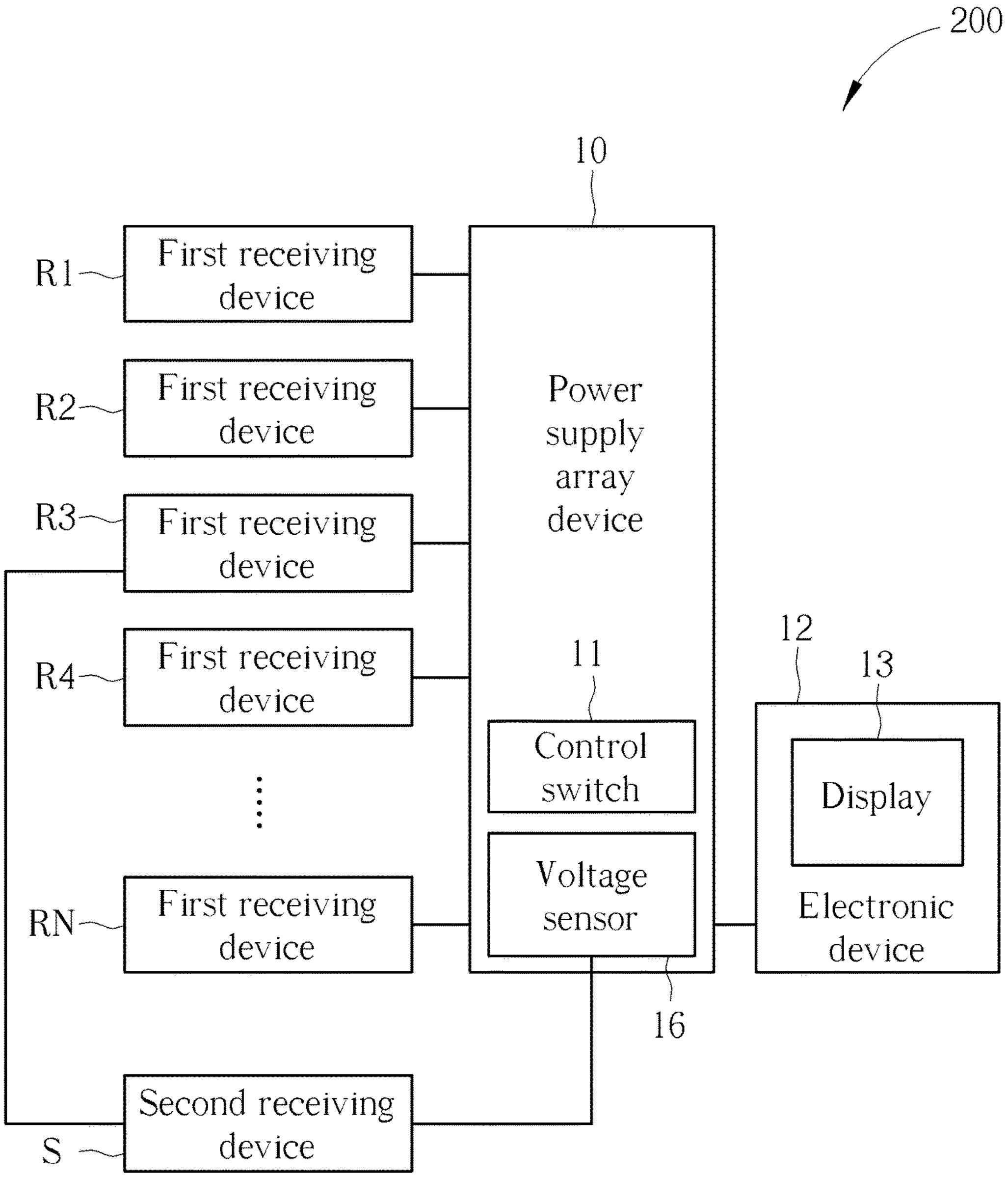
FIG. 4 is a structure of a power supply array system according to another embodiment of the present invention.

FIG. 4 is a structure of a power supply array system 200 according to another embodiment of the present invention. The power supply array system 200 is similar to the power supply array system 100. A difference is that a second receiving device S is introduced to the power supply array system 200. Further, the first receiving device R3 is coupled to the receiving device S and an output terminal CH3. However, a structure of the power supply array system 200 is not limited to a structure shown in FIG. 4. For example, several second receiving devices can be introduced and can be coupled to corresponding first receiving devices respectively. Here, the second receiving device S is introduced in FIG. 4 for presentation simplicity. In FIG. 4, the second receiving device S is coupled between the first receiving device R3 and the voltage sensor 16. Specifically, the voltage sensor 16 is used for detecting a driving voltage of the second receiving device S. As shown in FIG. 2, the voltage sensor 16 is coupled to the controller 14 of the power supply array device 10. Thus, when the voltage sensor 16 detects a driving voltage of the second receiving device S, the controller 14 can estimate a degree of voltage drop of the first receiving device R3. Then, a voltage outputted from the output terminal CH3 is boosted by the controller 14 for compensating the voltage drop of the first receiving device R3, thereby stabilizing the driving voltage of the first receiving device R3. For example, in the power supply array system 100 (i.e., no second receiving device S is introduced), when the output terminal CH3 is coupled to the first receiving device R3 and a target voltage is set as 21 volts, the output terminal CH3 of the power supply array device 10 outputs a voltage substantially equal to 21 volts. Then, the first receiving device R3 can be operated by a driving voltage substantially equal to 21 volts. However, when the second receiving device S is coupled to the first receiving device R3 in series, a driving voltage drop of the first receiving device R3 occurs because the driving voltage of the first receiving device R3 is partitioned according to an impedance ratio of the first receiving device R3 to the second receiving device S. For example, when the second receiving device S is coupled to the first receiving device R3 in series, the driving voltage of the first receiving device R3 is reduced to 18 volts. To avoid the first receiving device R3 being driven abnormally, the voltage sensor 16 detects a driving voltage requirement (i.e., for example, 3 volts) of the second receiving device S. Further, the controller 14 can estimate a degree of voltage drop of the first receiving device R3 (i.e., the voltage drop is substantially equal to 3 volts). Then, the controller 14 can boost the voltage outputted from the output terminal CH3 for compensating the voltage drop of the first receiving device R3. As a result, when the voltage outputted from the output terminal CH3 is boosted, the driving voltage of the first receiving device R3 can be maintained (21 volts). Thus, operational stability of the receiving device R3 can be improved.

To sum up, the present invention discloses a power supply array system. The power supply array system includes a power supply array device capable of outputting multiple voltages independently. Particularly, since the power supply array device uses a simple circuit structure for outputting lots of independent voltages, the power supply array device is suitable for providing independent power sources to servers in a data center or a work station. Further, a power management function and a power monitoring function are also performed by the power supply array system automatically or manually. The user can acquire several operational statuses of the power supply array device in real time. Also, since the power supply array device can establish wired or wireless links to an external device, such as a computer, the monitoring data of all output terminals can be transmitted to the external device for analyzing system stability. Thus, when a layout error, a voltage mismatch, a circuit short, and/or an expectable glitch occurs, it can be easily observed and solved in a short time, thereby improving an error detection and error recovery efficiency. Further, a voltage sensor (V-Sense) is introduced to the power supply array device to avoid voltage drop when several circuit devices (i.e., receiving devices) are coupled in series. As a result, operational stability of the receiving devices of the power supply array system can also be improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A power supply array system, comprising:

a power supply array device configured to generate N voltages, comprising:

M adjustable power control boards configured to output the N voltages, wherein each power control board comprises a plurality of output terminals, and each output terminal is configured to output a voltage;

an adjustable input/output (I/O) circuit board coupled to the plurality of output terminals of the each power control board and configured to detect a voltage and a current of the each output terminal of the each power control board; and a controller coupled to the M adjustable power control boards and the adjustable input/output circuit board and configured to receive data of the voltage and current of the each output terminal of the each power control board, and configured to control the M adjustable power control boards accordingly;

N first receiving devices coupled to the M adjustable power control boards, wherein each first receiving device receives a voltage generated from the power supply array device;

a second receiving device, wherein one of the N first receiving devices is coupled to the second receiving device and one of the plurality of output terminals of one of the M adjustable power control boards; and a voltage sensor coupled to the controller and the second receiving device and configured to detect a driving voltage of the second receiving device;

wherein N and M are two integers greater than two and N>M.

2. The system of claim 1, wherein circuits of the M adjustable power control boards are identical, and the each adjustable power control board comprises two output terminals and configured to output two voltages to two first receiving devices respectively.

3. The system of claim 1, further comprising an electronic device;

wherein the power supply array device further comprises a connection module coupled to the controller and configured to transmit monitoring data of the voltage and the current outputted from the each output terminal of the each power control board to the electronic device.

4. The system of claim 3, wherein the electronic device comprises a display for displaying a monitoring interface, and the monitoring interface comprises:

a voltage configuration window configured to display N target voltages;

an outputting voltage window configured to display the N voltages outputted from the M adjustable power control boards currently; and a voltage meter window configured to display ratios of the N voltages to a maximum voltage supported by the M adjustable power control boards.

5. The system of claim 4, wherein the monitoring interface further comprises:

an outputting current window configured to display the N currents generated from the M adjustable power control boards through the N first receiving devices currently; and a current meter window configured to display ratios of the N currents to a maximum current supported by the M adjustable power control boards.

6. The system of claim 1, wherein the voltage sensor is disposed inside the power supply array device, and the power supply array device is a server-based power supply array device.

7. The system of claim 1, wherein when the voltage sensor detects the driving voltage of the second receiving device, the voltage sensor signals the controller to increase a voltage outputted from the output terminal according to the driving voltage.

8. The system of claim 1, further comprising a plurality of control switches coupled to the controller and configured to adjust a target voltage corresponding to each voltage of the N voltages.

9. The system of claim 1, wherein when a current of a first receiving device of the N first receiving devices is greater than a predetermined value, the controller disables an output terminal of the plurality of output terminals of an adjustable power control board of the M adjustable power control boards, and the first receiving device is coupled to the output terminal.

* * * * *